(12) United States Patent
Yamamoto

(10) Patent No.: US 11,929,760 B2
(45) Date of Patent: Mar. 12, 2024

(54) DA CONVERTER

(71) Applicant: Asahi Kasei Microdevices Corporation, Tokyo (JP)

(72) Inventor: Ryuzo Yamamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 172 days.

(21) Appl. No.: 17/752,801

(22) Filed: May 24, 2022

(65) Prior Publication Data

US 2022/0385300 A1 Dec. 1, 2022

(30) Foreign Application Priority Data

May 26, 2021 (JP) ................... 2021-088749

(51) Int. Cl.
*H03M 1/66* (2006.01)
*H03M 1/08* (2006.01)
*H03M 1/74* (2006.01)

(52) U.S. Cl.
CPC ............. *H03M 1/742* (2013.01); *H03M 1/08* (2013.01); *H03M 1/0863* (2013.01)

(58) Field of Classification Search
CPC ....... H03M 1/742; H03M 1/0863; H03M 1/08
USPC .......................................... 341/144, 120, 118
See application file for complete search history.

(56) References Cited

U.S. PATENT DOCUMENTS

| 5,438,369 A | * | 8/1995 | Citta .................. H04N 21/4382 |
| | | | 348/613 |
| 2003/0151533 A1 | | 8/2003 | Khoini-Poorfard |
| 2005/0225464 A1 | | 10/2005 | Lin |
| 2012/0013496 A1 | | 1/2012 | Nakamura |
| 2019/0288701 A1 | | 9/2019 | Matsuoka |

FOREIGN PATENT DOCUMENTS

JP 2014135601 A 7/2014

* cited by examiner

*Primary Examiner* — Peguy Jean Pierre

(57) ABSTRACT

Provided is a DA converter for outputting an analog signal according to an input digital signal, including a plurality of current output units to be input with the digital signal, which output a current according to the digital signal to a corresponding wiring, a conversion unit provided with a plurality of feedback paths respectively coupled to wirings corresponding to the current output units, and which selects at least one wiring among the wirings corresponding to the current output units and output an analog signal according to a current flowing in the selected wiring, and a first noise reduction unit provided with a plurality of first switches each of which switches whether to electrically connect to at least one wiring among the wirings corresponding to the current output units, and reduces a noise component generated in at least one of the plurality of current output units from the electrically coupled wiring.

20 Claims, 12 Drawing Sheets

«DA CONVERTER

The contents of the following Japanese patent application(s) are incorporated herein by reference:
NO. 2021-088749 filed in JP on May 26, 2021.

BACKGROUND

1. Technical Field

The present invention relates to a digital-to-analog (DA) converter.

2. Related Art

Up to now, a current output type DA conversion circuit has been provided with a current output circuit configured to cause a current based on an input digital signal to flow, and a conversion circuit configured to output an analog voltage according to a current output. In such a DA conversion circuit, a switch has been provided in the current output circuit, and a current value flowing In the conversion circuit has been switched in response to the input digital signal. Patent document 1 describes a technique for reducing distortion due to switching noise in the DA conversion circuit.
Patent document 1: Japanese Patent Application Publication No. 2019-161622

DESCRIPTION OF EXEMPLARY EMBODIMENTS

Hereinafter, the present invention will be described through embodiments of the invention, but the following embodiments do not limit the invention according to the claims. In addition, not all combinations of the features described in the embodiments necessarily have to be essential to solving means of the invention.

Figure 1:
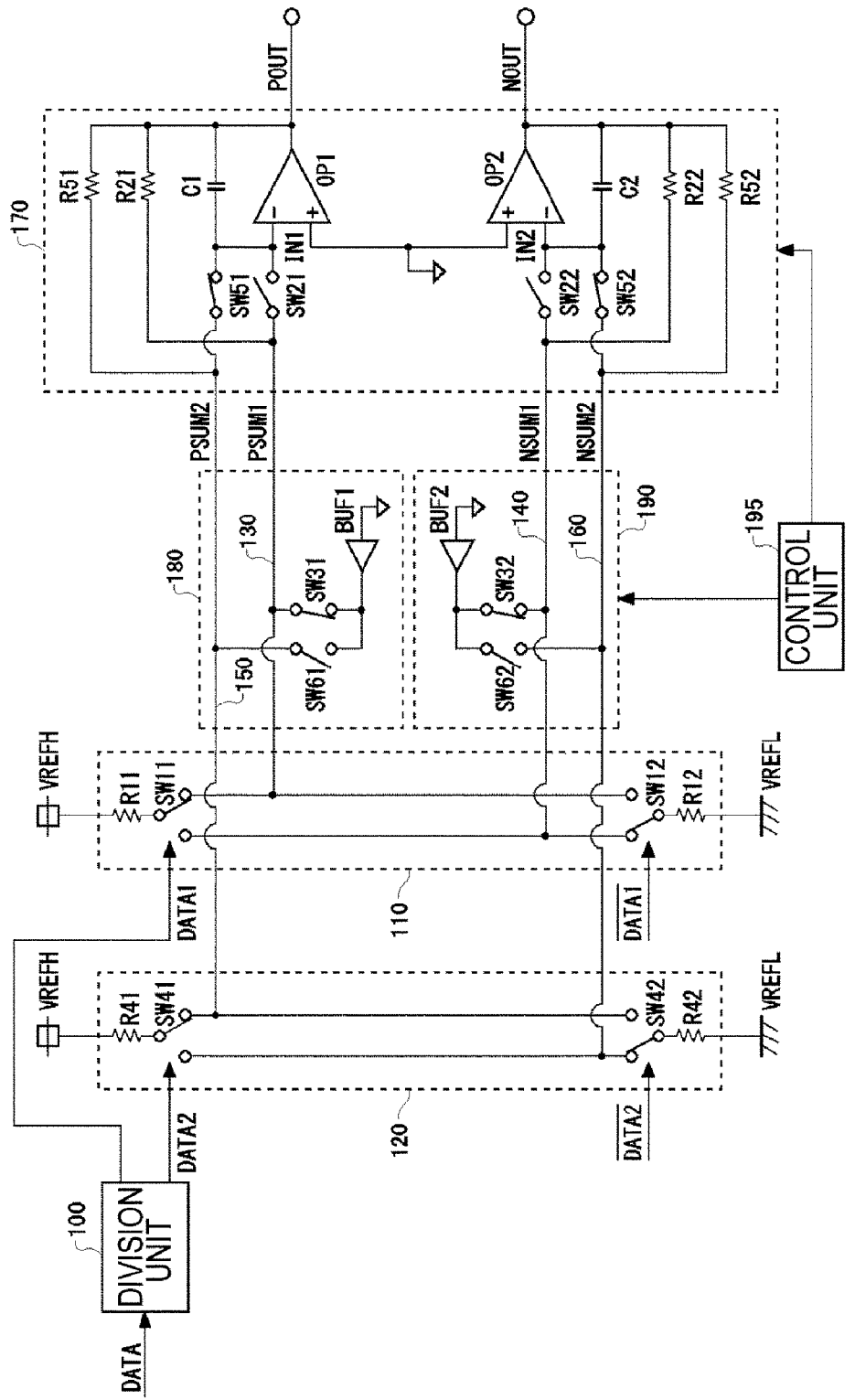
FIG. 1 illustrates a configuration example of a DA converter 10.

FIG. 1 illustrates a configuration example of a DA converter 10. The DA converter 10 is configured to convert an input digital signal into a differential analog signal. The DA converter 10 is provided with a division unit 100, a first current output unit 110, a second current output unit 120, a first wiring 130, a second wiring 150, a third wiring 140, a fourth wiring 160, a conversion unit 170, a first noise reduction unit 180, a second noise reduction unit 190, and a control unit 195.

The division unit 100 is coupled to the first current output unit 110 and the second current output unit 120. The division unit 100 is configured to divide an input digital signal DATA in a time-divisional manner, and output the divided digital signals to the first current output unit 110 and the second current output unit 120, respectively. The division unit 100 may divide the digital signal to output a digital signal DATA1 (odd-numbered data array) and a digital signal DATA2 (even-numbered data array) at a predetermined conversion rate. The division unit 100 may output a positive-side digital signal DATA1 and a negative-side digital signal DATA1 to the first current output unit 110, and output a positive-side digital signal DATA2 and a negative-side digital signal DATA2 to the second current output unit 120. The division unit 100 may generate both the positive-side digital signals DATA1 and DATA2 and the negative-side digital signals DATA1 and DATA2, and may also perform, for example, logic inversion of one of a) the positive-side digital signals DATA1 and DATA2 and b) the negative-side digital signals DATA1 and DATA2 to generate the other digital signals.

The first current output unit 110 is coupled to the first wiring 130 and the third wiring 140. The first current output unit 110 is configured to output a current according to the input digital signal DATA to each of the first wiring 130 and the third wiring 140. The first current output unit 110 outputs a current according to the positive-side digital signal DATA1, for example, to one of the first wiring 130 and the third wiring 140, and outputs a current according to the negative-side digital signal DATA1 to the other one of the first wiring 130 and the third wiring 140. The first current output unit 110 has resistors R11 and R12 and switches SW11 and SW12.

The resistor R11 is provided between a first potential VREFH and the switch SW11. For example, one end of the resistor R11 is coupled to the first potential VREFH, and the switch SW11 is coupled to the other end.

The switch SW11 is configured to switch a connection destination of the other end of the resistor R11 in response to the input digital signal DATA1. The switch SW11 electrically couples, for example, the other end of the resistor R11 to either the first wiring 130 or the third wiring 140. FIG. 1 illustrates an example in which the digital signal DATA1 input to the switch SW11 is the positive-side digital signal DATA1 included in the digital signal DATA.

The resistor R12 is provided between a second potential VREFL and the switch SW12. For example, one end of the resistor R12 is coupled to the second potential VREFL, and the switch SW12 is coupled to the other end. Note that the second potential VREFL may be a potential lower than the first potential VREFH.

The switch SW12 is configured to switch a connection destination of the other end of the resistor R12 in response to the input digital signal DATA1. The switch SW12 electrically couples, for example, the other end of the resistor R12 to either the first wiring 130 or the third wiring 140. FIG. 1 illustrates an example in which the digital signal DATA1 input to the switch SW12 is the negative-side digital signal DATA1 included in the digital signal DATA.

Herein, when the switch SW11 electrically couples the resistor R11 to the first wiring 130, the switch SW12 electrically couples the resistor R12 to the third wiring 140. In addition, when the switch SW11 electrically couples the resistor R11 to the third wiring 140, the switch SW12 electrically couples the resistor R12 to the first wiring 130. With this configuration, the first current output unit 110 can output the current based on the first potential VREFH and the resistor R11 to one of the first wiring 130 and the third wiring 140, and output the current based on the second potential VREFL and the resistor R12 to the other one of the first wiring 130 and the third wiring 140. Note that the current based on the first potential VREFH and the resistor R11 may be a current having a positive current value, and in addition, the current based on the second potential VREFL and the resistor R12 may be a current having a negative current value.

The second current output unit 120 is coupled to the second wiring 150 and the fourth wiring 160. The second current output unit 120 is configured to output a current according to an input digital signal DATA to each of the second wiring 150 and the fourth wiring 160. The second current output unit 120 outputs a current according to the positive-side digital signal DATA2, for example, to one of the second wiring 150 and the fourth wiring 160, and outputs a current according to the negative-side digital signal DATA2 to the other one of the second wiring 150 and the fourth wiring 160. The second current output unit 120 has resistors R41 and R42 and switches SW41 and SW42.

The resistor R41 is provided between the first potential VREFH and the switch SW41. For example, one end of the resistor R41 is coupled to the first potential VREFH, and the switch SW41 is coupled to the other end.

The switch SW41 is configured to switch a connection destination of the other end of the resistor R41 in response to the input digital signal DATA2. The switch SW41 electrically couples, for example, the other end of the resistor R41 to either the second wiring 150 or the fourth wiring 160. FIG. 1 illustrates an example in which the digital signal DATA2 input to the switch SW41 is the positive-side digital signal DATA2 included in the digital signal DATA.

The resistor R42 is provided between the second potential VREFL and the switch SW42. For example, one end of the resistor R42 is coupled to the second potential VREFL, and the switch SW42 is coupled to the other end.

The switch SW42 is configured to switch a connection destination of the other end of the resistor R42 in response to the input digital signal DATA2. The switch SW42 electrically couples, for example, the other end of the resistor R42 to either the second wiring 150 or the fourth wiring 160. FIG. 1 illustrates an example in which the digital signal DATA2 input to the switch SW42 is the negative-side digital signal DATA2 included in the digital signal DATA.

Herein, when the switch SW41 electrically couples the resistor R41 to the second wiring 150, the switch SW42 electrically couples the resistor R42 to the fourth wiring 160. In addition, when the switch SW41 electrically couples the resistor R41 to the fourth wiring 160, the switch SW42 electrically couples the resistor R42 to the second wiring 150. With this configuration, the second current output unit 120 can output the current based on the first potential VREFH and the resistor R41 to one of the second wiring 150 and the fourth wiring 160, and output the current based on the second potential VREFL and the resistor R42 to the other one of the second wiring 150 and the fourth wiring 160. Note that the current based on the first potential VREFH and the resistor R41 may be a current having a positive current value, and in addition, the current based on the second potential VREFL and the resistor R42 may be a current having a negative current value.

The first wiring 130 and the third wiring 140 are provided between the first current output unit 110 and the conversion unit 170. FIG. 1 illustrates an example in which the first wiring 130 is coupled to a positive-side input PSUM1 of the conversion unit 170, and the third wiring 140 is coupled to a negative-side input NSUM1 of the conversion unit 170.

The second wiring 150 and the fourth wiring 160 are provided between the second current output unit 120 and the conversion unit 170. FIG. 1 illustrates an example in which the second wiring 150 is coupled to a positive-side input PSUM2 of the conversion unit 170, and the fourth wiring 160 is coupled to a negative-side input NSUM2 of the conversion unit 170.

The conversion unit 170 is configured to select any of the currents flowing in the first wiring 130, the second wiring 150, the third wiring 140, and the fourth wiring 160, and output an analog signal in response to the selected current. The conversion unit 170 may output a voltage signal based on the currents flowing in the first wiring 130 and the second wiring 150 as a positive-side analog signal POUT, and output a voltage signal based on the currents flowing in the third wiring 140 and the fourth wiring 160 as a negative-side analog signal NOUT. The conversion unit 170 may function as a current-to-voltage conversion circuit. The conversion unit 170 has a first amplification unit OP1, a second amplification unit OP2, a plurality of positive-side switches SW21 and SW51, a plurality of negative-side switches SW22 and SW52, a first feedback capacitor C1, a plurality of first feedback resistors R21 and R51, a second feedback capacitor C2, and a plurality of second feedback resistors R22 and R52.

Each of the first amplification unit OP1 and the second amplification unit OP2 may have an amplifier circuit configured to amplify an input signal. FIG. 1 illustrates an example in which the first amplification unit OP1 and the second amplification unit OP2 are operation amplifiers. Herein, a negative-side input of the first amplification unit OP1 is set as IN1, and a negative-side input of the second amplification unit OP2 is set as IN2. In addition, a positive-side input of the first amplification unit OP1 and a positive-side input of the second amplification unit OP2 are both coupled to a reference potential (as an example, a ground potential).

The positive-side switches SW21 and SW51 are configured to switch whether to establish electric connection between the positive-side inputs PSUM1 and PSUM2 of the conversion unit 170 and the negative-side input IN1 of the first amplification unit OP1. The negative-side switches SW22 and SW52 are configured to switch whether to establish electric connection between the negative-side inputs NSUM1 and NSUM2 of the conversion unit 170 and the negative-side input IN2 of the second amplification unit OP2. The positive-side switches SW21 and SW51 and the negative-side switches SW22 and SW52 switch electric connection and disconnection in response to a control signal received from the control unit 195.

Each of the first feedback capacitor C1 and the first feedback resistors R21 and R51 is provided between an input and an output of the first amplification unit OP1. FIG. 1 illustrates an example in which the first feedback capacitor C1 is coupled between the negative-side input IN1 of the first amplification unit OP1 and the output of the first amplification unit OP1. In addition, FIG. 1 illustrates an example in which the first feedback resistors R21 and R51 are coupled between the positive-side inputs PSUM1 and PSUM2 and the output of the first amplification unit OP1.

Each of the second feedback capacitor C2 and the second feedback resistors R22 and R52 is provided between an input and an output of the second amplification unit OP2. FIG. 1 illustrates an example in which the second feedback capacitor C2 is coupled between the negative-side input IN2 of the second amplification unit OP2 and the output of the second amplification unit OP2. In addition, FIG. 1 illustrates an example in which the second feedback resistors R22 and R52 are coupled between the negative-side inputs NSUM1 and NSUM2 and the output of the second amplification unit OP2.

The conversion unit 170 described above is provided with a plurality of feedback paths respectively coupled to wirings corresponding to the first current output unit 110 and the second current output unit 120. The conversion unit 170 is provided with feedback paths between an output of the conversion unit 170 and each of the first wiring 130, the second wiring 150, the third wiring 140, and the fourth wiring 160, and charges a current input to each of the positive-side inputs PSUM1 and PSUM2 and the negative-side inputs NSUM1 and NSUM2 to output a voltage according to the input current. FIG. 1 illustrates an example in which the conversion unit 170 outputs the voltage according to the input current of the positive-side inputs PSUM1 and PSUM2 from the positive-side output POUT, and outputs the voltage according to the input current of the negative-side inputs NSUM1 and NSUM2 from the negative-side output NOUT.

The first noise reduction unit 180 is coupled between the first wiring 130 and the second wiring 150, and the reference potential. The first noise reduction unit 180 is configured to reduce a noise component generated at the time of switching of at least either the first current output unit 110 or the second current output unit 120. The first noise reduction unit 180 has a plurality of first switches SW31 and SW61 and a first buffer BUF1.

The first switches SW31 and SW61 are respectively configured to switch whether to electrically connect to the first wiring 130 and the second wiring 150. The first switch SW31 is provided between the first wiring 130 and the first buffer BUF1, and switches whether to electrically connect the first buffer BUF1 to the first wiring 130. The first switch SW61 is provided between the second wiring 150 and the first buffer BUF1, and switches whether to electrically connect the first buffer BUF1 to the second wiring 150. The first switches SW31 and SW61 switch an electrically coupled state (on) and a decoupled state (off) in response to a control signal supplied from the control unit 195.

The first buffer BUF1 is provided between the plurality of first switches SW31 and SW61 and the reference potential. Note that the reference potential is not particularly limited, and as an example, may be (the first potential VREFH+the second potential VREFL)/2 or may also be a ground potential. The reference potential is coupled to an input terminal of the first buffer BUF1, and the first switches SW31 and SW61 are coupled to an output terminal of the first buffer BUF1. Therefore, for example, in a case where electric charge due to the noise component is charged in parasitic capacitances or the like of the positive-side inputs PSUM1 and PSUM2 of the conversion unit 170 which are coupled to the first wiring 130 and the second wiring 150, when the first switches SW31 and SW61 are put into an on state, the first buffer BUF1 is configured to operate so as to discharge the charged electric charge.

The first noise reduction unit 180 electrically couples a wiring that is not selected by the conversion unit 170 out of the first wiring 130 and the second wiring 150 to at least one of the plurality of first switches SW31 or SW61. With this configuration, by discharging the electric charge charged in the conversion unit 170 via the first wiring 130 and the second wiring 150 due to the noise component generated in at least either the first current output unit 110 or the second current output unit 120 in a state in which the first switches SW31 and SW61 are in an on state, the first noise reduction unit 180 reduces the noise component from the electrically coupled wiring.

The second noise reduction unit 190 is coupled between the third wiring 140 and the fourth wiring 160, and the reference potential. The second noise reduction unit 190 is configured to reduce a noise component generated at the time of switching of at least either the first current output unit 110 or the second current output unit 120. The second noise reduction unit 190 has a plurality of second switches SW32 and SW62 and a second buffer BUF2.

The second switches SW32 and SW62 are respectively configured to switch whether to electrically connect to the third wiring 140 and the fourth wiring 160 coupled to the negative-side inputs NSUM1 and NSUM2 of the conversion unit 170. The second switch SW32 is provided between the third wiring 140 and the second buffer BUF2, and switches whether to electrically connect the second buffer BUF2 to the third wiring 140. The second switch SW62 is provided between the fourth wiring 160 and the second buffer BUF2, and switches whether to electrically connect the second buffer BUF2 to the fourth wiring 160. The second switches SW32 and SW62 switch an electrically coupled state (on) and a decoupled state (off) in response to a control signal supplied from the control unit 195.

The second buffer BUF2 is provided between the plurality of second switches SW32 and SW62, and the reference potential. Note that the reference potential is not particularly limited, and as an example, may be (the first potential VREFH+the second potential VREFL)/2 or may also be a ground potential. The reference potential is coupled to an input terminal of the second buffer BUF2, and the second switches SW32 and SW62 are coupled to an output terminal of the second buffer BUF2. Therefore, for example, in a case where electric charge due to the noise component is charged in parasitic capacitances or the like of the negative-side inputs NSUM1 and NSUM2 of the conversion unit 170 which are coupled to the third wiring 140 and the fourth wiring 160, the second switches SW32 and SW62 are put into an on state, the second buffer BUF2 is configured to operate so as to discharge the charged electric charge.

The second noise reduction unit 190 electrically couples a wiring that is not selected by the conversion unit 170 out of the third wiring 140 and the fourth wiring 160 to at least one of the plurality of second switches SW32 or SW62. With this configuration, by discharging the electric charge charged in the conversion unit 170 via the third wiring 140 and the fourth wiring 160 due to the noise component generated in at least either the first current output unit 110 or the second current output unit 120 in a state in which the second switches SW32 and SW62 are in an on state, the second noise reduction unit 190 reduces the noise component from the electrically coupled wiring.

The control unit 195 is configured to control switching of each of the plurality of first switches SW31 and SW61 of the first noise reduction unit 180, the plurality of second switches SW32 and SW62 of the second noise reduction unit 190, and the switches SW21, SW22, SW51, and SW52 of the conversion unit 170. The control unit controls timings of connection states of the first switches SW31 and SW61 and the second switches SW32 and SW62 such that timing at which a digital value of the digital signal DATA is switched arrives after the first switches SW31 and SW61 and the second switches SW32 and SW62 are put into an on state. Therefore, the control unit 195 may control the switching of the plurality of first switches SW31 and SW61 of the first noise reduction unit 180, the plurality of second switches SW32 and SW62 of the second noise reduction unit 190, and the switches SW21, SW22, SW51, and SW52 of the conversion unit 170 based on switching timings of the switches SW11, SW12, SW41, and SW42 of the first current output unit 110 and the second current output unit 120. The control unit 195 may perform control such that when the first switch SW31 coupled to the first wiring 130 is in on state, the first switch SW61 coupled to the second wiring 150 is put into an off state, and such that when the first switch SW61 coupled to the second wiring 150 is in an on state, the first switch SW31 coupled to the first wiring 130 is put into an off state. The switching of each of the switches by the control unit 195 will be described next.

Figure 2A:
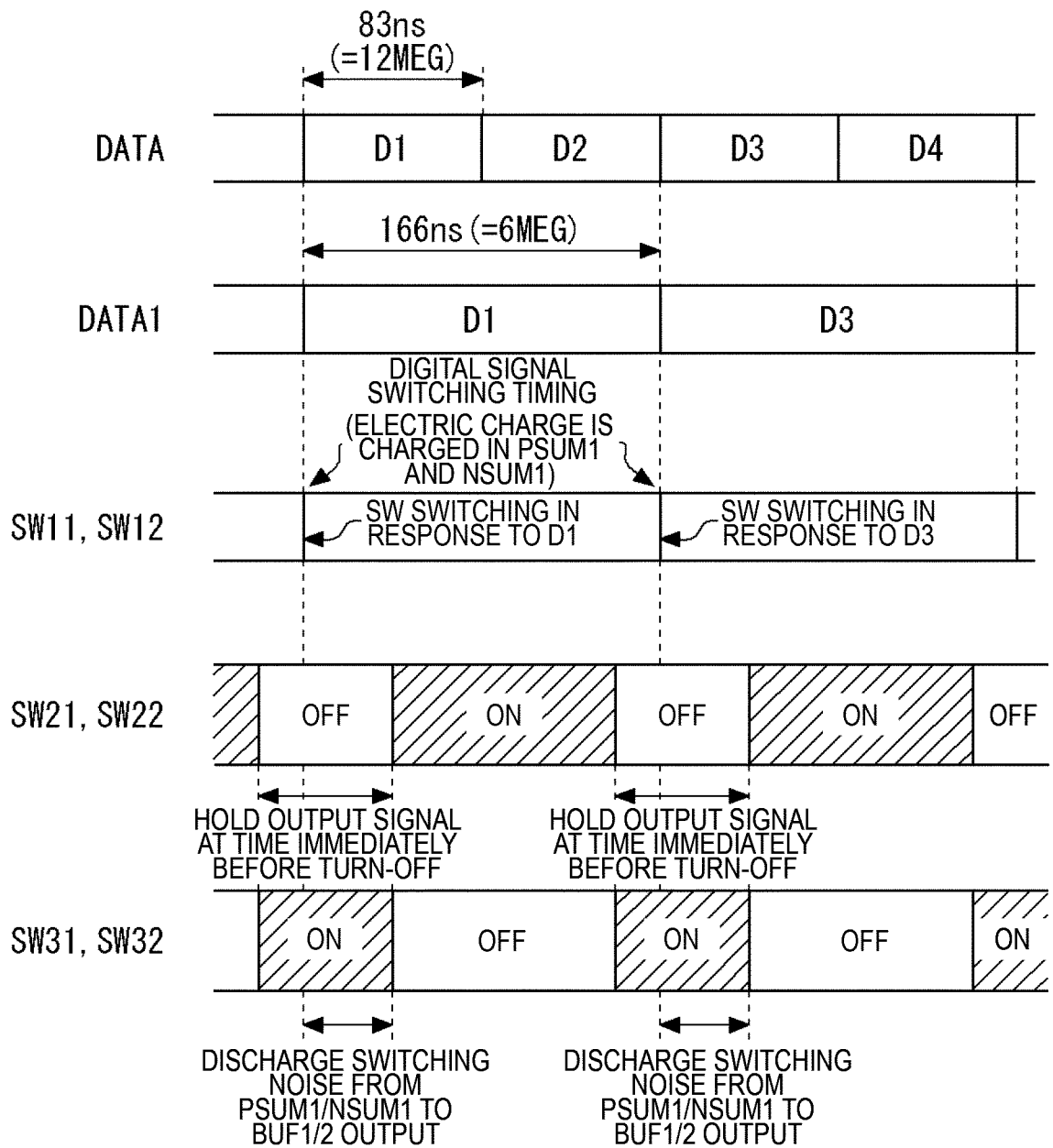
FIG. 2A illustrates an example of operation timing in the DA converter 10.
Figure 2B:
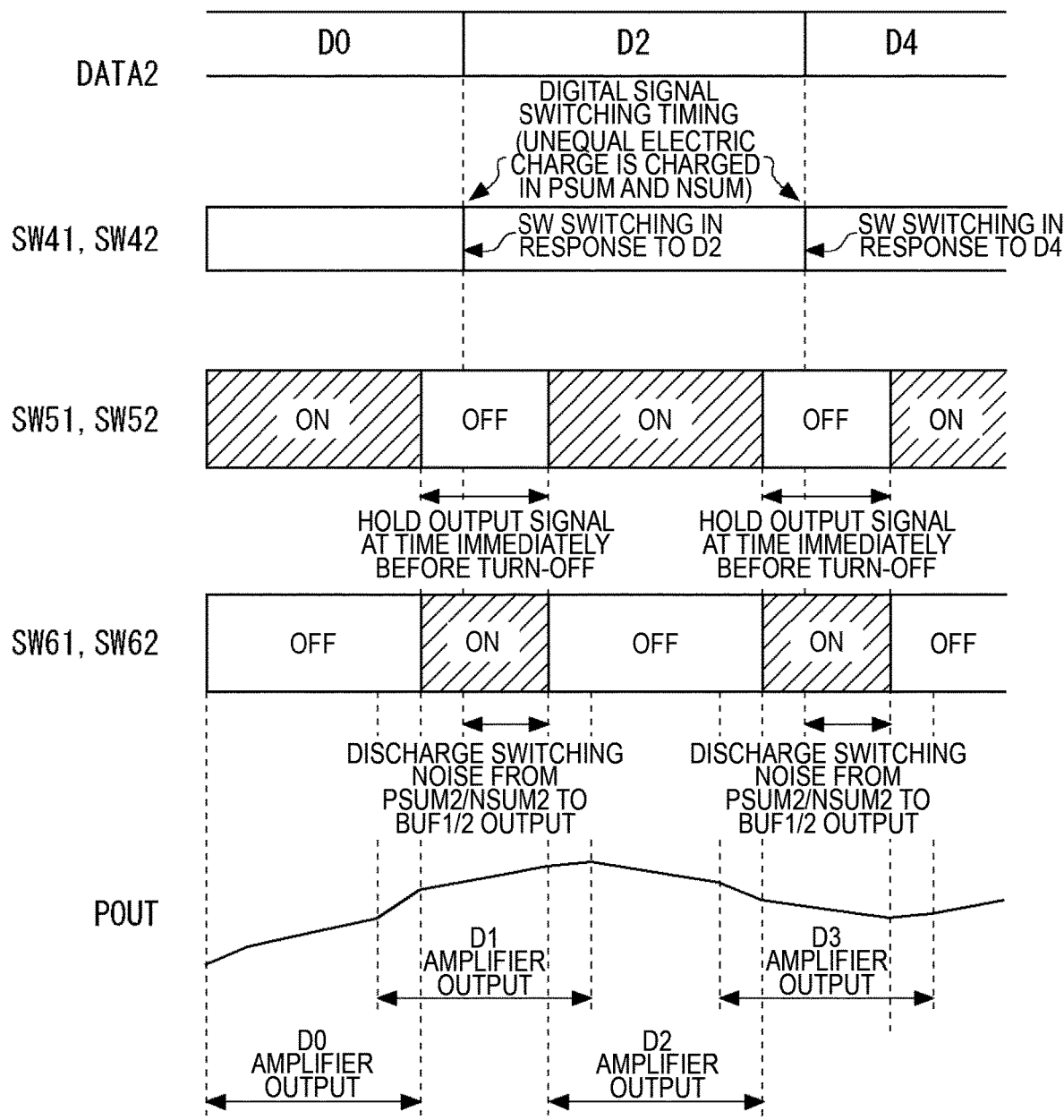
FIG. 2B illustrates an example of the operation timing in the DA converter 10.

FIG. 2A and FIG. 2B illustrate an example of an operation timing under a 12 MEGHz operation condition, for example, in the DA converter 10 according to the present embodiment illustrated in FIG. 1. FIG. 2A illustrates an operation timing of the DA converter 10 for the digital signal DATA1, and FIG. 2B illustrates an operation timing of the DA converter 10 for the digital signal DATA2 on a same time axis as FIG. 2A. A horizontal axis of FIG. 2A and FIG. 2B represents time, and a vertical axis represents a signal intensity and contents and the like of a signal. Note that the operation condition is an example, and is not particularly limited.

In FIG. 2A, "DATA" denotes an input digital signal, "DATA1" denotes the digital signal DATA1 in FIG. 1 at a conversion rate of 6 MEGHz, for example, "SW11, SW12" denote operations of the switches SW11 and SW12, "SW21, SW22" denote operations of the switches SW21 and SW22, and "SW31, SW32" denote operations of the switches SW31 and SW32. In addition, in FIG. 2B, "DATA2" denotes the digital signal DATA2 in FIG. 1 at the conversion rate of 6 MEGHz, for example, "SW41, SW42" denote operations of the switches SW41 and SW42, "SW51, SW52" denote operations of the switches SW51 and SW52, "SW61, SW62" denote operations of the switches SW61 and SW62, and "POUT" denotes the positive-side analog signal POUT output from the conversion unit 170.

For example, at first timing at which DATA1 is switched to D1 in FIG. 2A, the switch SW11 electrically couples the other end of the resistor R11 to the first wiring 130. In this case, at second timing at which DATA1 is switched to D3, the switch SW11 electrically decouplesdecouples the other end of the resistor R11 from the first wiring 130, and electrically couples the other end of the resistor R11 to the third wiring 140. An operation represented by "SW11" in FIG. 2A is an example of such a switching operation of the switch SW11.

In this case, at the first timing, the switch SW12 electrically couples one end of the resistor R12 to the third wiring 140. In addition, at the second timing, the switch SW12 electrically decouplesdecouples the one end of the resistor R12 from the third wiring 140, and electrically couples the one end of the resistor R12 to the first wiring 130. An operation represented by "SW12" in FIG. 2A is an example of such a switching operation of the switch SW12.

For the above described switching operations of the switch SW11 and the switch SW12, the control unit 195 controls switching of the switches SW21 and SW22 of the conversion unit 170, the switch SW31 of the first noise reduction unit 180, and the second switch SW32 of the second noise reduction unit 190. For example, the control unit 195 generates and supplies control signals such that timing arrives for switching the switch SW11 and the switch SW12 after the electric connections of the switches SW21 and SW22 are decoupled (turned off) and the electric connections of the first switch SW31 and the second switch SW32 are coupled (turned on). In this manner, at timing earlier than the first timing or the second timing by a predetermined time period, the control unit 195 couples (turns on) the electric connections of the first switch SW31 and the second switch SW32.

For example, in a case where electric charge due to a switching noise component is charged in the parasitic capacitance or the like of the positive-side input PSUM1 of the conversion unit 170 which is coupled to the first wiring 130, when the first switch SW31 is put into an on state, the first buffer BUF1 operates so as to discharge the charged electric charge.

In FIG. 2B, at third timing at which DATA2 is switched from D0 to D2, the switch SW41 electrically couples the other end of the resistor R41 to the second wiring 150. In this case, at fourth timing at which DATA2 is switched to D4, the switch SW41 electrically decouplesdecouples the other end of the resistor R41 from the second wiring 150, and electrically couples the other end of the resistor R41 to the fourth wiring 160. An operation represented by "SW41" in FIG. 2B is an example of such a switching operation of the switch SW41.

In this case, at the third timing, the switch SW42 electrically couples the one end of the resistor R42 to the fourth wiring 160. In addition, at the fourth timing, the switch SW42 electrically decouplesdecouples the one end of the resistor R42 from the fourth wiring 160, and electrically couples the one end of the resistor R42 to the second wiring 150. An operation represented by "SW42" in FIG. 2B is an example of such a switching operation of the switch SW42.

For the above described switching operations of the switch SW41 and the switch SW42, the control unit 195 controls switching of the switches SW51 and SW52 of the conversion unit 170, the first switch SW61 of the first noise reduction unit 180, and the second switch SW62 of the second noise reduction unit 190. For example, the control unit 195 generates and supplies control signals such that timing arrives for switching the switch SW41 and the switch SW42 after the electric connections of the switches SW51 and SW52 are decoupled (turned off) and the electric connections of the first switch SW61 and the second switch SW62 are coupled (turned on). In this manner, at timing earlier than the third timing or the fourth timing by a predetermined time period, the control unit 195 couples (turns on) the electric connections of the first switch SW61 and the second switch SW62.

For example, in a case where the electric charge due to the noise component is charged in the parasitic capacitance or the like of the positive-side input PSUM2 of the conversion unit 170 which is coupled to the second wiring 150, when the first switch SW61 is put into an on state, the first buffer BUF1 operates so as to discharge the charged electric charge.

As illustrated in FIG. 2A and FIG. 2B, by shifting the switching timing of the digital signal DATA1 from the switching timing of the digital signal DATA2, operations can be performed at a double conversion rate (at 12 MEGHz in FIG. 2A and FIG. 2B), and the positive-side analog signal POUT of such a voltage as illustrated in FIG. 2B can be output. As a feature of this configuration, since the noise components are discharged independently of each of the current output units 110 and 120, a number of feedback resistors R21, R22, R51, and R52 according to the current output units are needed.

Figure 3:
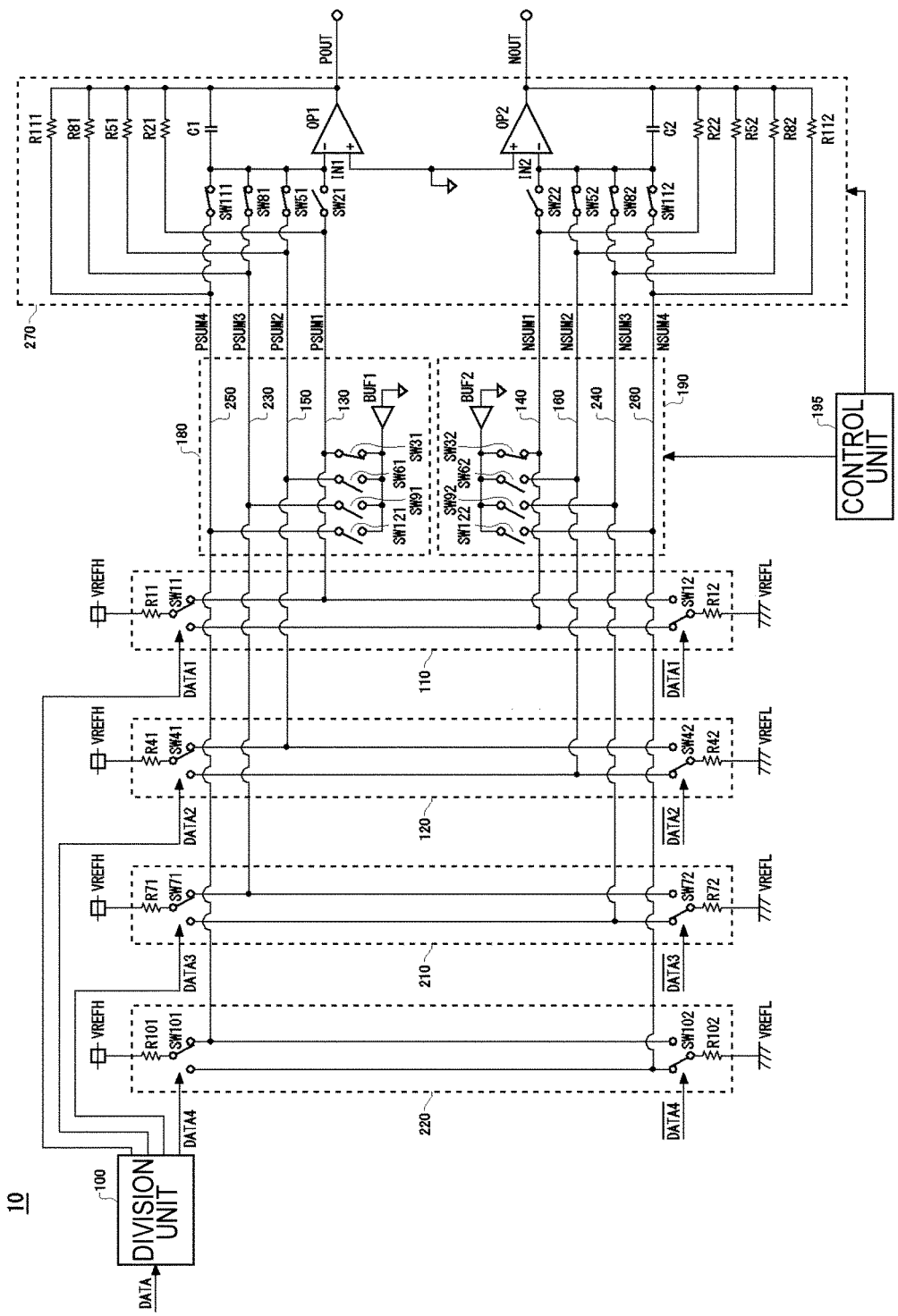
FIG. 3 illustrates a modified example of the DA converter 10.

FIG. 3 illustrates a modified example of the DA converter 10. The DA converter 10 of the modified example has a configuration similar to the DA converter 10 of FIG. 1, but is further provided with a third current output unit 210 and a fourth current output unit 220. The DA converter 10 of the modified example is provided with, corresponding to the third current output unit 210 and the fourth current output unit 220, a fifth wiring 230, a sixth wiring 250, a seventh wiring 240, an eighth wiring 260, switches SW81, SW82, SW91, SW92, SW101, SW102, SW111, SW112, SW121, and SW122, and feedback resistors R81, R82, R111, and R112. Hereinafter, configurations different from the DA converter 10 of FIG. 1 and FIG. 2 will be mainly described.

The division unit 100 divides the digital signal DATA in a time-divisional manner into four digital signals DATA1, DATA2, DATA3, and DATA4, and outputs the divided digital signals to the first current output unit 110 to the fourth current output unit 220, respectively.

The third current output unit 210 is coupled to the fifth wiring 230 and the seventh wiring 240. The third current output unit 210 is configured to output a current according to the input digital signal DATA to each of the fifth wiring 230 and the seventh wiring 240. The third current output unit 210 outputs a current according to the positive-side digital signal DATA3, for example, to one of the fifth wiring 230 and the seventh wiring 240, and outputs a current according to the negative-side digital signal DATA3 to the other one of the fifth wiring 230 and the seventh wiring 240. The third current output unit 210 has resistors R71 and R72 and switches SW71 and SW72.

The resistor R71 is provided between the first potential VREFH and the switch SW71. For example, one end of the resistor R71 is coupled to the first potential VREFH, and the switch SW71 is coupled to the other end.

The switch SW71 is configured to switch a connection destination of the other end of the resistor R71 in response to the positive-side input digital signal DATA3. The switch SW71 electrically couples, for example, the other end of the resistor R71 to either the fifth wiring 230 or the seventh wiring 240.

The resistor R72 is provided between the second potential VREFL and the switch SW72. For example, one end of the resistor R72 is coupled to the second potential VREFL, and the switch SW72 is coupled to the other end.

The switch SW72 is configured to switch a connection destination of the other end of the resistor R72 in response to the input negative-side digital signal DATA3. The switch SW72 electrically couples, for example, the other end of the resistor R72 to either the fifth wiring 230 or the seventh wiring 240.

The third current output unit 210 can output the current according to the digital signal DATA3 by similarly operating as in the first current output unit 110 or the second current output unit 120. Similarly as in the first current output unit 110 or the second current output unit 120, by switching on and off of the switches SW81 and SW82 of a conversion unit 270, the control unit 195 may switch whether to respectively electrically connect a positive-side input PSUM3 and a negative-side input NSUM3 of the conversion unit 270 to which the fifth wiring 230 and the seventh wiring 240 are coupled, to the negative-side inputs IN1 and IN2 of the first amplification unit OP1 and the second amplification unit OP2.

The feedback resistors R81 and R82 in the conversion unit 270 are respectively provided between the input and the output of the first amplification unit OP1 and between the input and the output of the second amplification unit OP2.

The first switch SW91 and the second switch SW92 are respectively coupled between the first buffer BUF1 and the fifth wiring 230 and between the second buffer BUF2 and the seventh wiring 240. By switching on and off of the first switch SW91 and the second switch SW92, the control unit 195 may control discharge of electric charge from the fifth wiring 230 and the seventh wiring 240 due to the first noise reduction unit 180 and the second noise reduction unit 190.

The fourth current output unit 220 is coupled to the sixth wiring 250 and the eighth wiring 260. The fourth current output unit 220 is configured to output a current according to the input digital signal DATA to each of the sixth wiring 250 and the eighth wiring 260. The fourth current output unit 220 outputs a current according to the positive-side digital signal DATA4, for example, to one of the sixth wiring 250 and the eighth wiring 260, and outputs a current according to the negative-side digital signal DATA4 to the other one of the sixth wiring 250 and the eighth wiring 260. The fourth current output unit 220 has resistors R101 and R102 and switches SW101 and SW102.

The resistor R101 is provided between the first potential VREFH and the switch SW101. For example, one end of the resistor R101 is coupled to the first potential VREFH, and the switch SW101 is coupled to the other end.

The switch SW101 is configured to switch a connection destination of the other end of the resistor R101 in response to the input positive-side digital signal DATA4. The switch SW101 electrically couples, for example, the other end of the resistor R101 to either the sixth wiring 250 or the eighth wiring 260.

The resistor R102 is provided between the second potential VREFL and the switch SW102. For example, one end of the resistor R102 is coupled to the second potential VREFL, and the switch SW102 is coupled to the other end.

The switch SW102 is configured to switch a connection destination of the other end of the resistor R102 in response to the input negative-side digital signal DATA4. The switch SW102 electrically couples, for example, the other end of the resistor R102 to either the sixth wiring 250 or the eighth wiring 260.

The fourth current output unit 220 can output the current according to the digital signal DATA4 by similarly operating as in the first current output unit 110 or the second current output unit 120. Similarly as in the first current output unit 110 or the second current output unit 120, by switching on and off of the switches SW101 and SW102 of the conversion unit 170, the control unit 195 may switch whether to respectively electrically connect a positive-side input PSUM4 and a negative-side input NSUM4 of the conversion unit 170 to which the sixth wiring 250 and the eighth wiring 260 are coupled, to the negative-side inputs IN1 and IN2 of the first amplification unit OP1 and the second amplification unit OP2.

The feedback resistors R111 and R112 in the conversion unit 270 are respectively provided between the input and the output of the first amplification unit OP1 and between the input and the output of the second amplification unit OP2.

The first switch SW121 and the second switch SW122 are respectively coupled between the first buffer BUF1 and the sixth wiring 250 and between the second buffer BUF2 and the eighth wiring 260. By switching on and off of the first switch SW121 and the second switch SW122, the control unit 195 may control discharge of electric charge from the sixth wiring 250 and the eighth wiring 260 due to the first noise reduction unit 180 and the second noise reduction unit 190.

Figure 4A:
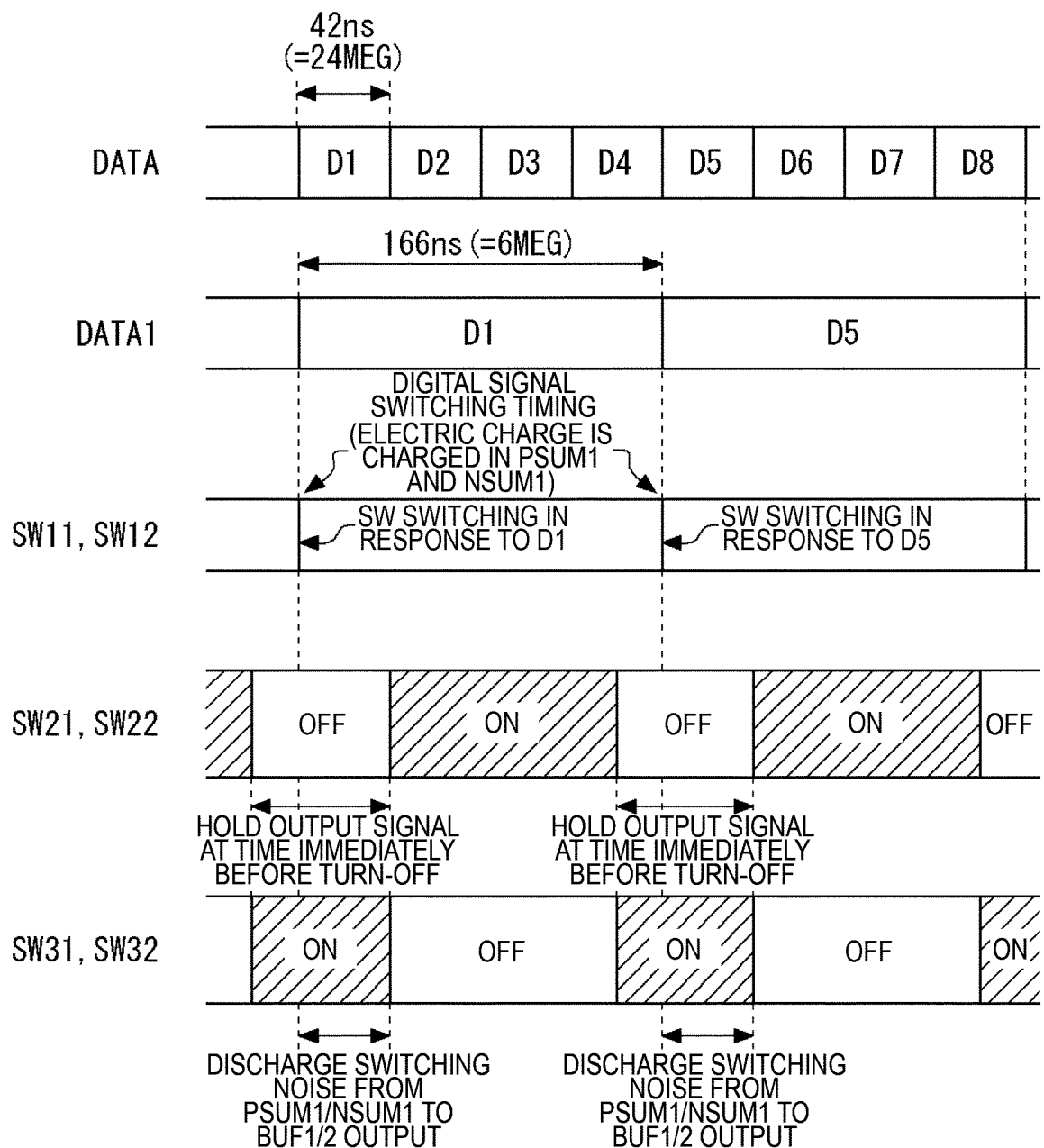
FIG. 4A illustrates an example of the operation timing in DA converter 10.
Figure 4B:
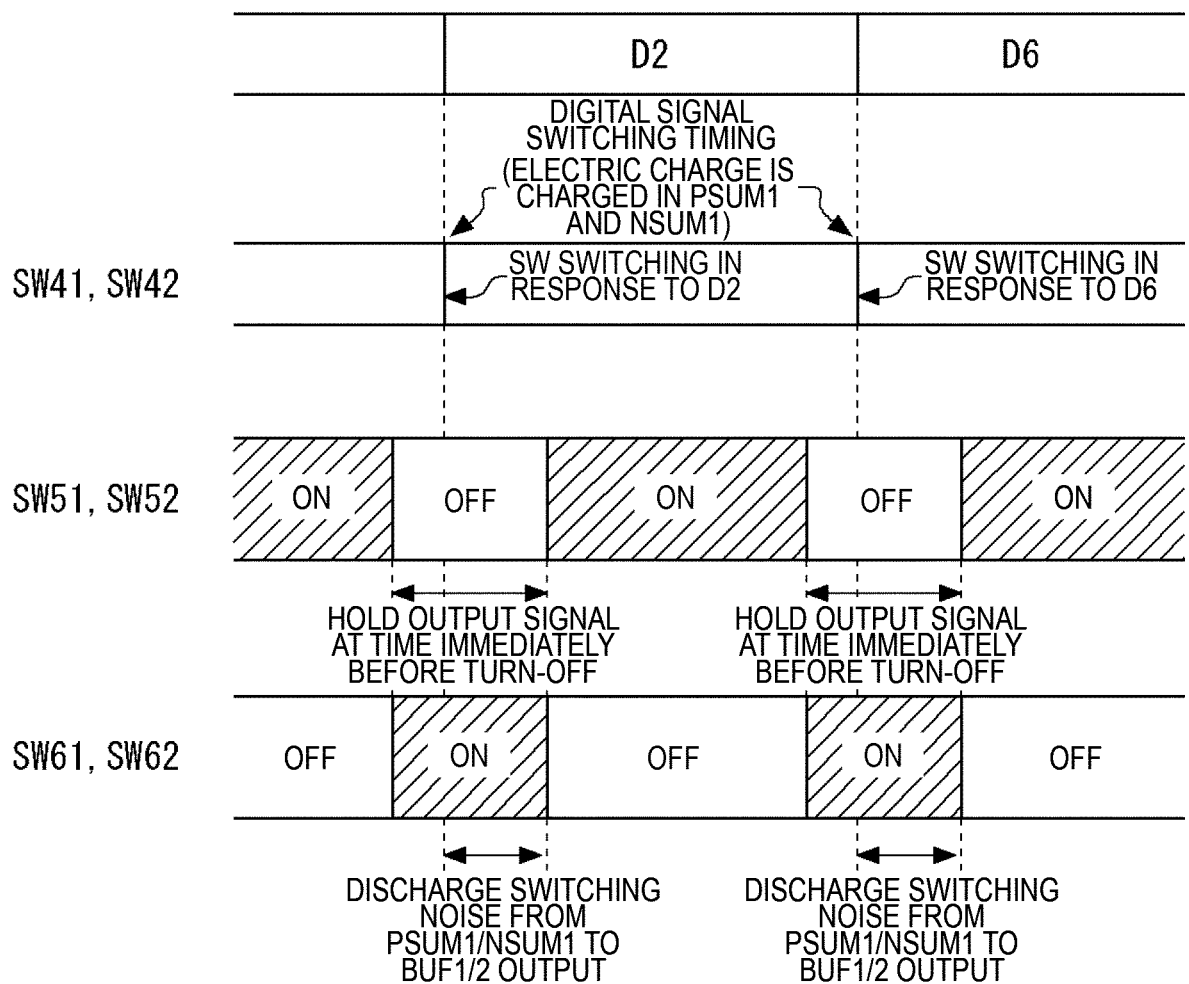
FIG. 4B illustrates an example of the operation timing in the DA converter 10.
Figure 4C:
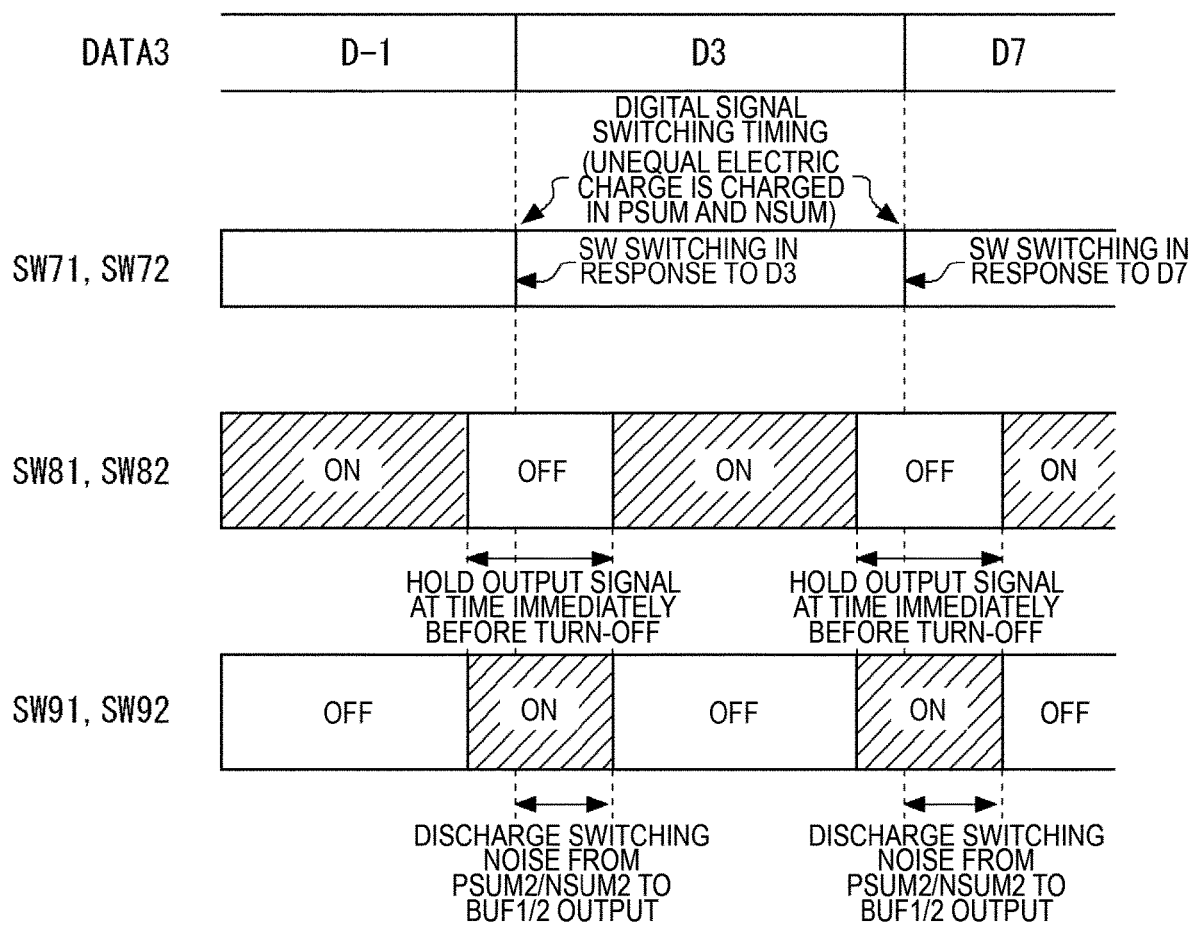
FIG. 4C illustrates an example of the operation timing in the DA converter 10.
Figure 4D:
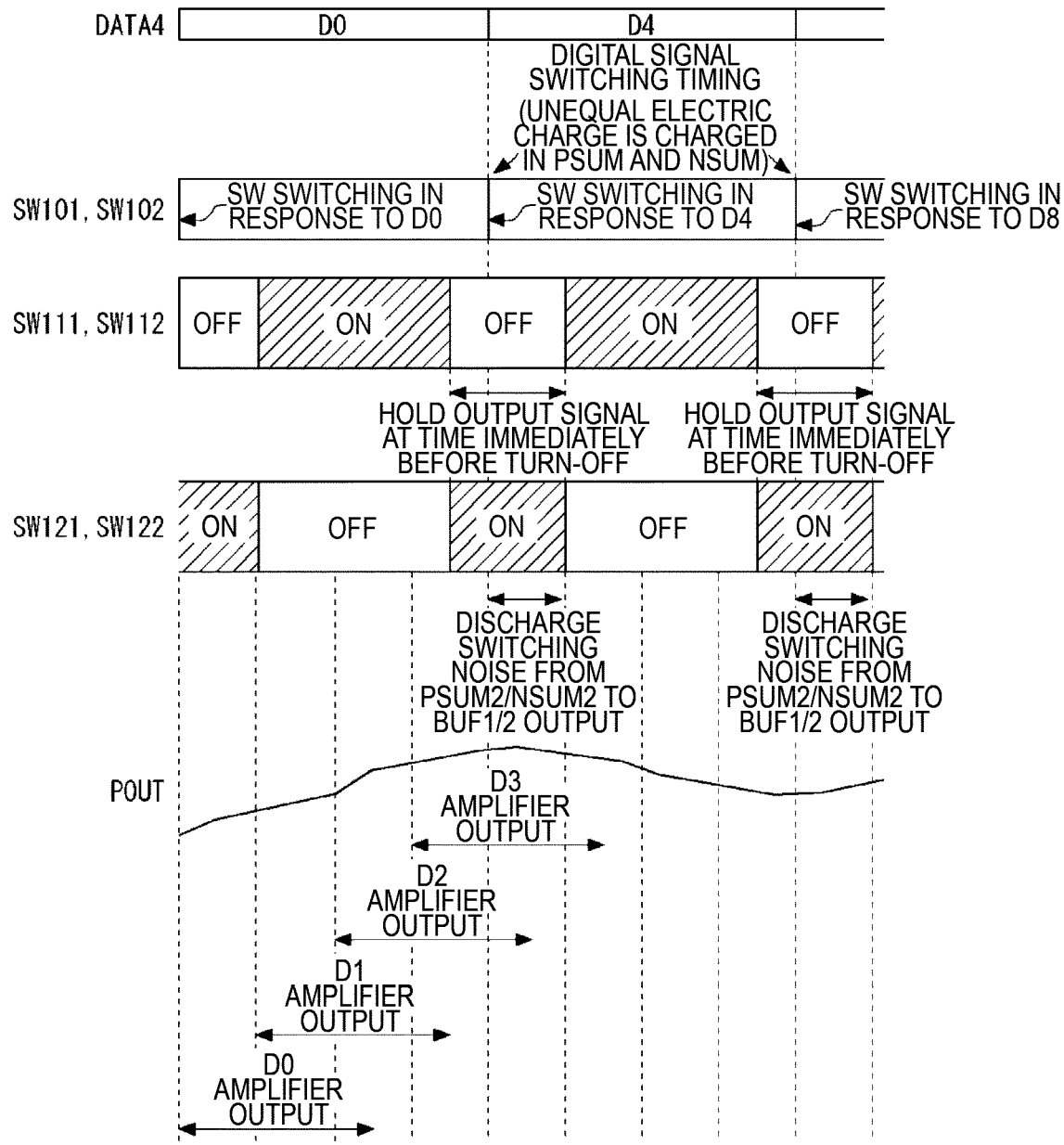
FIG. 4D illustrates an example of the operation timing in the DA converter 10.

FIG. 4A to FIG. 4D illustrate an example of operation timing under an operation condition of 24 MEGHz, for example, in the DA converter 10 according to the present embodiment illustrated in FIG. 3. FIG. 4A illustrates an operation timing of the DA converter 10 for the digital signal DATA1, FIG. 4B illustrates an operation timing of the DA converter 10 for the digital signal DATA2 on a same time axis as FIG. 4A, FIG. 4C illustrates an operation timing of the DA converter 10 for the digital signal DATA3 on the same time axis as FIG. 4A, and FIG. 4D illustrates an operation timing of the DA converter 10 for the digital signal DATA4 on the same time axis as FIG. 4A. FIG. 4A to FIG. 4D illustrate a vertical axis and a horizontal axis similarly as in FIG. 2A and FIG. 2B. The operation of the DA converter 10 illustrated in FIG. 4A and FIG. 4B may be similar to the operation illustrated in FIG. 2A and FIG. 2B.

In FIG. 4C, "DATA3" denotes the digital signal DATA3 in FIG. 3 at a conversion rate of 6 MEGHz, for example, "SW71, SW72" denote operations of the switches SW71 and SW72, "SW81, SW82" denote operations of the switches SW81 and SW82, and "SW91, SW92" denote operations of the switches SW91 and SW92. In addition, in FIG. 4D, "DATA4" denotes the digital signal DATA4 in FIG. 3 at the conversion rate of 6 MEGHz, for example, "SW101, SW102" denote operations of the switches SW101 and SW102, "SW111, SW112" denote operations of the switches SW111 and SW112, and "SW121, SW122" denote operations of the switches SW121 and SW122.

At timing at which DATA3 is switched from D-1 to D3 in FIG. 4C, the switch SW71 electrically couples the other end of the resistor R71 to the fifth wiring 230. In this case, at timing at which DATA3 is switched to D7, the switch SW71 electrically decouplesdecouples the other end of the resistor R71 from the fifth wiring 230, and electrically couples the other end of the resistor R71 to the seventh wiring 240. An operation represented by "SW71" in FIG. 4C is an example of such a switching operation of the switch SW71.

In this case, at the timing of switching to D3, the switch SW72 electrically couples one end of the resistor R72 to the seventh wiring 240. In addition, at the timing of switching to D7, the switch SW72 electrically decouples the one end of the resistor R72 from the seventh wiring 240, and electrically couples the one end of the resistor R72 to the fifth wiring 230. An operation represented by "SW72" in FIG. 4C is an example of such a switching operation of the switch SW72.

For the above described switching operations of the switch SW71 and the switch SW72, the control unit 195 controls switching of the switches SW81 and SW82 of the conversion unit 170, the first switch SW91 of the first noise reduction unit 180, and the second switch SW92 of the second noise reduction unit 190. For example, the control unit 195 generates and supplies control signals such that timing arrives for switching the switch SW71 and the switch SW72 after the electric connections of the switches SW81 and SW82 are decoupled (turned off) and the electric connections of the first switch SW91 and the second switch SW92 are coupled (turned on). In this manner, at timing earlier than the timing of the switching of the digital signal DATA3 by a predetermined time period, the control unit 195 couples (turns on) the electric connections of the first switch SW91 and the second switch SW92.

At timing at which DATA4 is switched to D4 in FIG. 4D, the switch SW101 electrically couples the other end of the resistor R101 to the sixth wiring 250. In this case, at timing at which DATA4 is switched to D8, the switch SW101 electrically decouples the other end of the resistor R101 from the sixth wiring 250, and electrically couples the other end of the resistor R101 to the eighth wiring 260. An operation represented by "SW101" in FIG. 4D is an example of such a switching operation of the switch SW101.

In this case, at the timing of switching to D4, the switch SW102 electrically couples the one end of the resistor R102 to the eighth wiring 260. In addition, at the timing of switching to D8, the switch SW102 electrically decouples the one end of the resistor R102 from the eighth wiring 260, and electrically couples the one end of the resistor R102 to the sixth wiring 250. An operation represented by "SW102" in FIG. 4D is an example of such a switching operation of the switch SW102.

For the above described switching operations of the switch SW101 and the switch SW102, the control unit 195 controls switching of the switches SW111 and SW112 of the conversion unit 170, the first switch SW121 of the first noise reduction unit 180, and the second switch SW122 of the second noise reduction unit 190. For example, the control unit 195 generates and supplies control signals such that timing arrives for switching the switch SW101 and the switch SW102 after the electric connections of the switches SW111 and SW112 are decoupled (turned off) and the electric connections of the first switch SW121 and the second switch SW122 are coupled (turned on). In this manner, at timing earlier than the timing of the switching of the digital signal DATA4 by a predetermined time period, the control unit 195 couples (turns on) the electric connections of the first switch SW121 and the second switch SW122.

The digital signal DATA at the conversion rate of 24 MEGHz is divided by the division unit 100 into the digital signals DATA1, DATA2, DATA3, and DATA4 at the conversion rate of 6 MEGHz. Although the conversion rate of each of the digital signals DATA1, DATA2, DATA3, and DATA4 is 6 MEGHz, by shifting the switching timings of the digital signals DATA1, DATA2, DATA3, and DATA4 from each other in the first current output unit 110 to the fourth current output unit 220, operations can be performed in which the output is at the data conversion rate of 24 MEGHz. It is possible to enable n-fold high speed operations in the DA converter 10 by using n pieces of current output units and employing a configuration and operations similar to those described above.

For the first current output unit 110 to the fourth current output unit 220, since the DA converter 10 described above has the noise reduction unit as a discharge circuit that can be independently coupled, time interleaving operations can be enabled without being affected from the switching noise at the time of the data switching which is a cause of distortion, and a sufficient holding period and a sufficient amplifier output period can be secured, so that a digital-to-analog conversion circuit can be realized in which a distortion characteristic is not degraded even under a high speed condition. In addition, with regard to the output data, since the current data and the previous data are regularly averaged, 4-tap FIR effects can also be attained.

Note that with regard to the DA converter 10 according to the present embodiment, the example has been described in which the first noise reduction unit 180 and the second noise reduction unit 190 respectively have the first buffer BUF1 and the second buffer BUF2, but is not limited to this. The first noise reduction unit 180 and the second noise reduction unit 190 may have capacitive elements such as a first capacitor and a second capacitor instead of the first buffer BUF1 and the second buffer BUF2 or in addition to the first buffer BUF1 and the second buffer BUF2. In this case, the first capacitor and the second capacitor may be alternatively arranged in the positions of the first buffer BUF1 and the second buffer BUF2.

In addition, the example has been illustrated in which the DA converter 10 according to the present embodiment outputs the differential analog signal according to the digital signal, but is not limited to this, and the DA converter 10 may output an analog signal from a single output. In this case, an arrangement may be adopted where the DA converter 10 does not have a plurality of configurations on the positive side or the negative side (for example, either the first amplification unit OP1 or the second amplification unit OP2, and a plurality of configurations for processing a signal to be input to either the first amplification unit OP1 or the second amplification unit OP2). In addition, the DA converter 10 may be provided with three or five or more of current output units having a configuration and a function similar to those of any of the first current output unit 110 to the fourth current output unit 220, and in this case, the division unit 100 may divide the digital signal DATA into three or five or more of digital signals in a time-divisional manner and output the divided digital signals.

Figure 5:
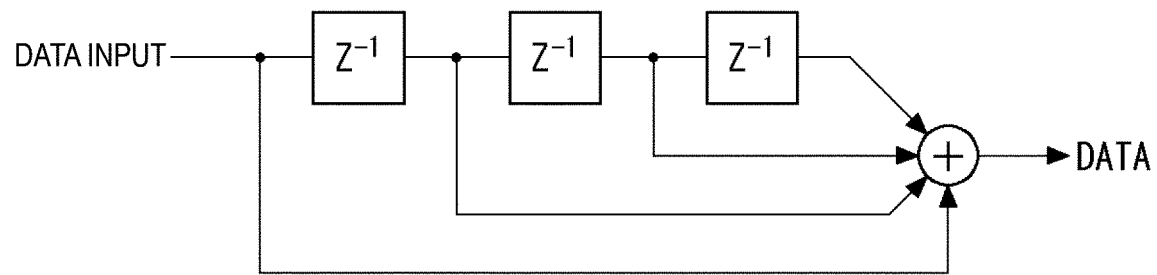
FIG. 5 illustrates a DATA processing circuit example of the present embodiment.

FIG. 5 illustrates a DATA processing circuit example of the present embodiment. When aliasing of out-of-band noise in a band due to the time interleaving operations of the DA converter 10 of the present embodiment degrades the characteristic, the degradation due to the aliasing can be suppressed by applying a filter effect to the DATA. FIG. 5 illustrates an example in which the noise aliasing from fs/2 and fs/4 is suppressed by inserting zero points at fs/2 and fs/4 in a 4-tap FIR filter. Note that the noise can be effectively suppressed by the filter when the filter is designed according to a position where the characteristic degradation occurs, and a shape or the like of the filter is not particularly limited.

Figure 6:
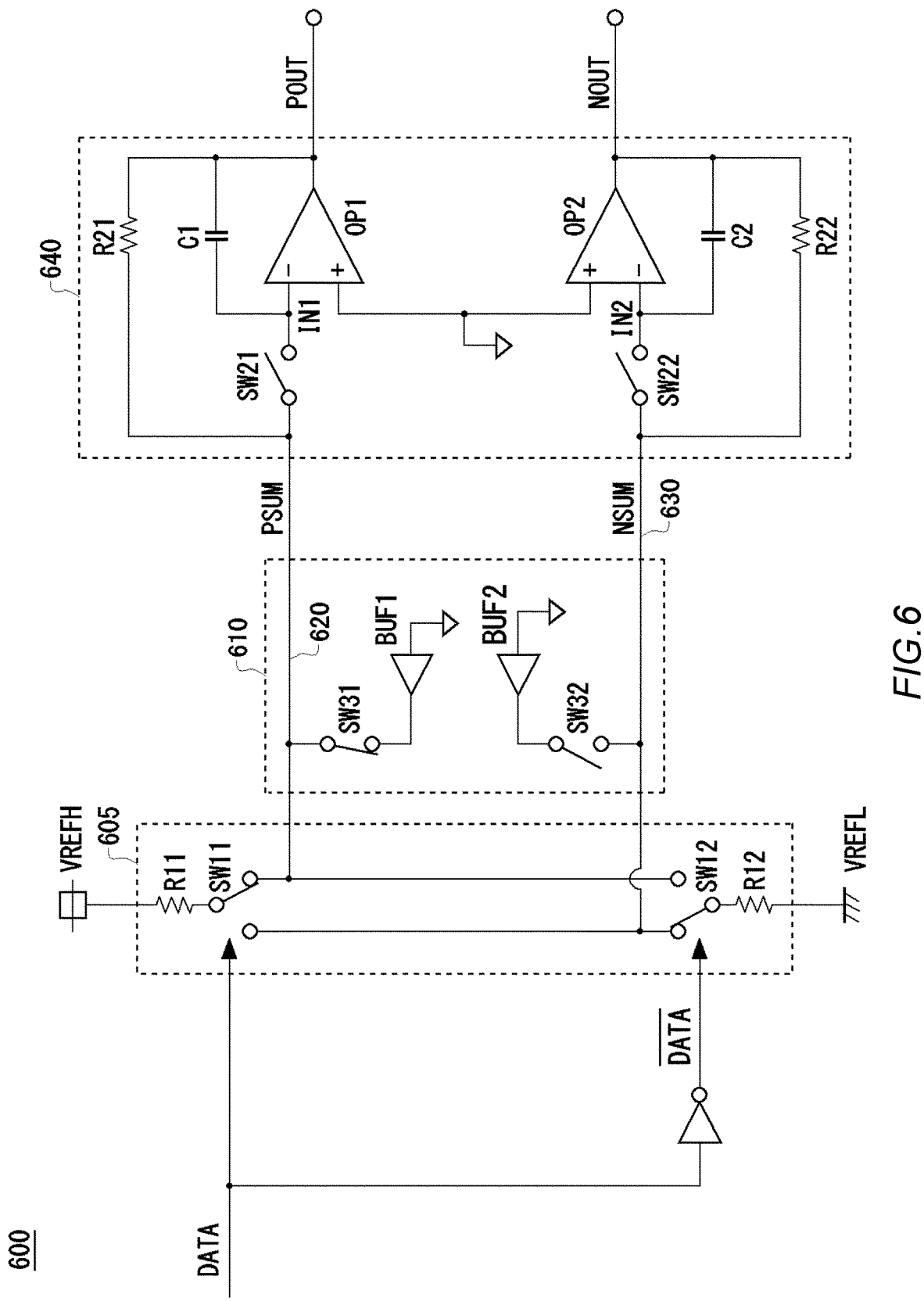
FIG. 6 illustrates a configuration of a DA converter 600 of a comparative example.

FIG. 6 illustrates a configuration of a DA converter 600 of a comparative example. The DA converter 600 of the comparative example has a configuration similar to the DA converter 10 of FIG. 1, but the DA converter 600 does not have the division unit 100 and the second current output unit 120. The DA converter 600 of the comparative example has a current output unit 605, a noise reduction unit 610, wirings 620 and 630 and a conversion unit 640, and each of the configurations may have a configuration similar to the first current output unit 110, the first noise reduction unit 180 and the second noise reduction unit 190, and the conversion unit 170 of the DA converter 10 of FIG. 1.

Figure 7:
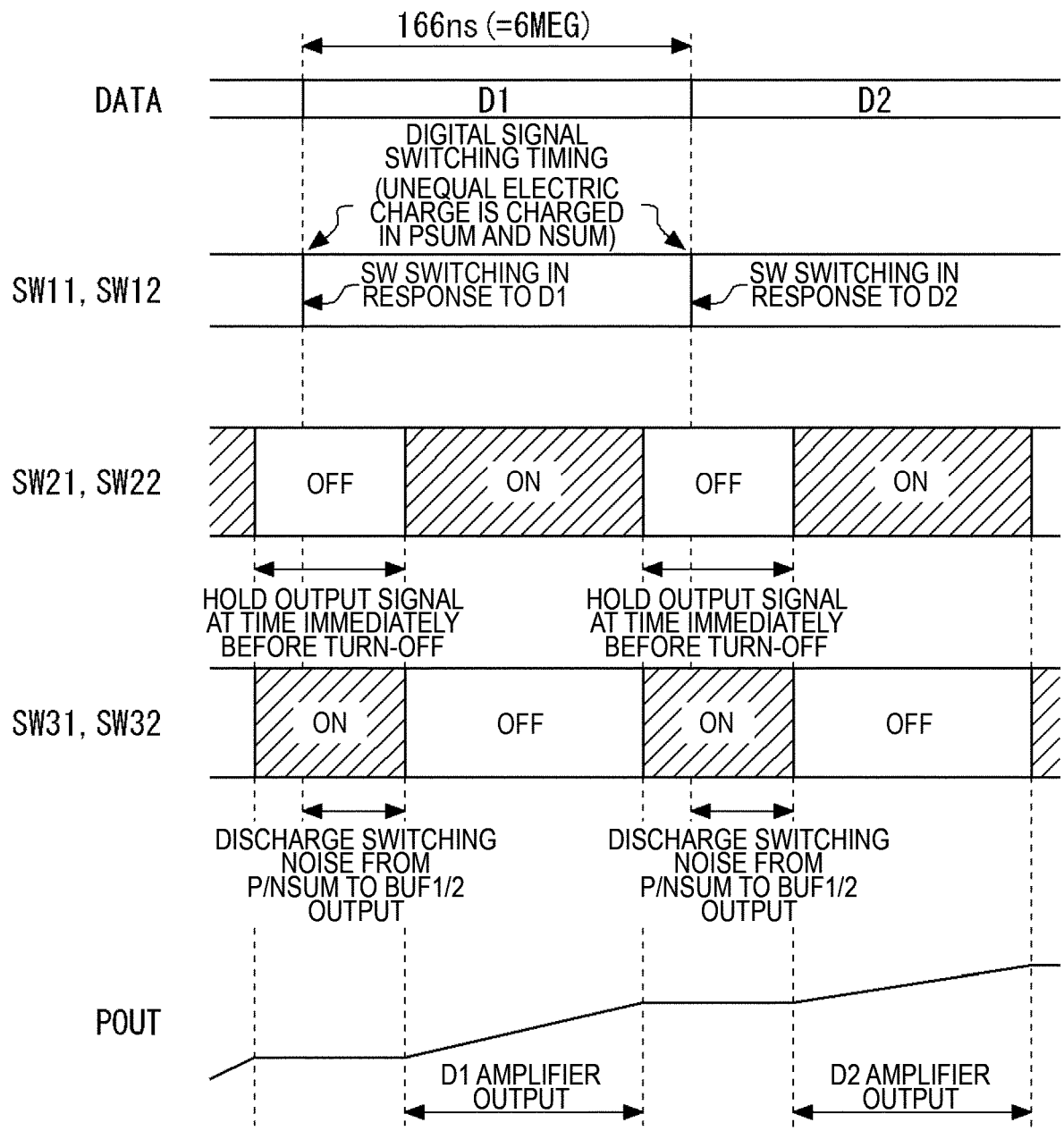
FIG. 7 illustrates an example of operation timing in the DA converter 600 of the comparative example.

FIG. 7 illustrates an example of operation timing under an operation condition of 6 MEGHz, for example, in the DA converter 600 of the comparative example. The current output unit 605, the noise reduction unit 610, and the conversion unit 640 of the DA converter 600 of the comparative example may respectively similarly operate as in the first current output unit 110, the first noise reduction unit 180 and the second noise reduction unit 190, and the conversion unit 170 of the DA converter 10 of FIG. 1. In relatively low speed operations as in FIG. 7, the distortion can be reduced by the noise reduction unit 610 to some extent, but the holding period and the amplifier output period are not sufficiently secured, and the reduction of the distortion is not sufficient.

Figure 8:
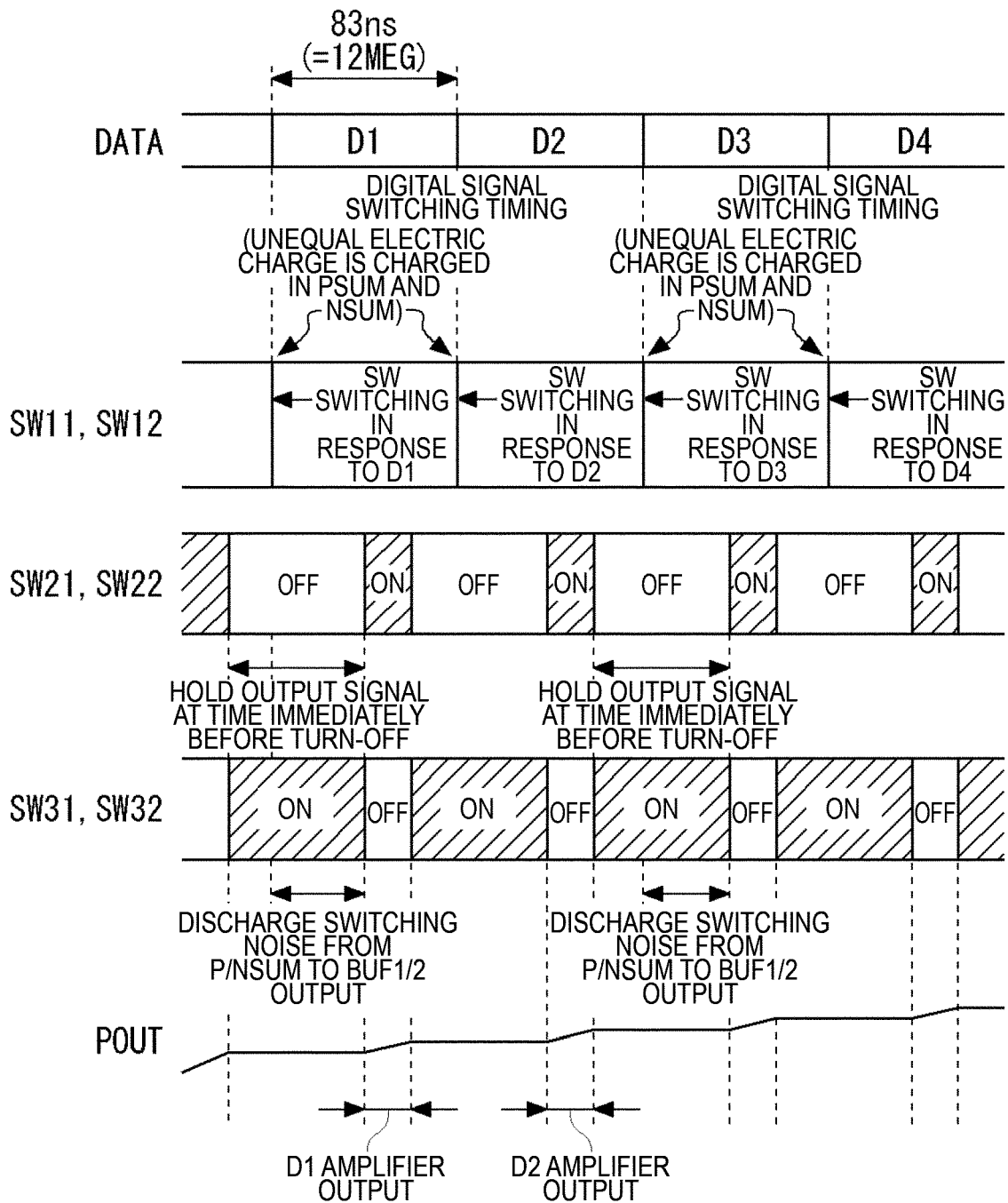
FIG. 8 illustrates an example of the operation timing in the DA converter 600 of the comparative example.

FIG. 8 illustrates an example of operation timing under an operation condition of 12 MEGHz, for example, in the DA converter 600 of the comparative example. In FIG. 8, the current output unit 605, the noise reduction unit 610, and the conversion unit 640 of the DA converter 600 of the comparative example may respectively similarly operate as in the first current output unit 110, the first noise reduction unit 180 and the second noise reduction unit 190, and the conversion unit 170 of the DA converter 10 of FIG. 1. Under the relatively high speed operation condition as in FIG. 8, when a period in which the switches SW21 and SW22 of the conversion unit 640 are turned off is sufficiently secured so as to discharge the switching noise, a period in which the first amplification unit OP1 and the second amplification unit OP2 of the conversion unit 640 change the output voltage in response to the digital signal DATA is insufficient, and the distortion is further degraded.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A DA converter for outputting an analog signal according to an input digital signal, the DA converter comprising:
    a plurality of current output circuits to be input with the digital signal, and configured to output a current according to the digital signal to a corresponding wiring;
    a conversion circuit provided with a plurality of feedback paths respectively coupled to wirings corresponding to the plurality of current output circuits, and configured to select at least one wiring among the wirings corresponding to the plurality of current output circuits and output an analog signal according to a current flowing in the selected wiring; and
    a first noise reduction circuit provided with a plurality of first switches each of which is configured to switch whether to electrically connect to at least one wiring among the wirings corresponding to the plurality of current output circuits, and configured to reduce a noise component generated in at least one of the plurality of current output circuits from the electrically coupled wiring.

2. The DA converter according to claim 1, wherein
    the plurality of current output circuits include a first current output circuit and a second current output circuit respectively configured to output a current according to the digital signal to a first wiring and a second wiring, the conversion circuit is configured to select at least one current out of a current flowing in the first wiring and of a current flowing the second wiring, and output the analog signal according to the selected current, and the first noise reduction circuit is provided with the plurality of first switches respectively configured to switch whether to electrically connect to the first wiring and the second wiring, and is configured to reduce the noise component generated in at least either the first current output circuit or the second current output circuit.

3. The DA converter according to claim 2, comprising:
a division unit configured to divide the digital signal in a time-divisional manner and output the divided digital signals to the first current output circuit and the second current output circuit, respectively.

4. The DA converter according to claim 3, wherein the first noise reduction circuit is provided between the first wiring and the second wiring, and a reference potential, and is electrically coupled, by at least one of the plurality of first switches, to a wiring that is not selected by the conversion circuit out of the first wiring and the second wiring.

5. The DA converter according to claim 3, wherein the first noise reduction circuit is configured to discharge electric charge charged in the conversion circuit when at least one of the plurality of first switches is in an on state.

6. The DA converter according to claim 3, wherein the conversion circuit is provided with feedback paths between an output of the conversion circuit and each of the first wiring and the second wiring.

7. The DA converter according to claim 3, wherein the first noise reduction circuit is further provided with a first buffer between the plurality of first switches and a reference potential.

8. The DA converter according to claim 3, comprising:
a control unit configured to control a connection state of each of the plurality of first switches, wherein
the control unit is configured to control timings of the connection states of the plurality of first switches such that timing at which a digital value of the digital signal is switched arrives after the plurality of first switches are put into an on state.

9. The DA converter according to claim 3, wherein
the first wiring and the second wiring are coupled to a first input of the conversion circuit, and
the first current output circuit and the second current output circuit are respectively configured to further output a current according to the digital signal to a third wiring and a fourth wiring which are coupled to a second input of the conversion circuit.

10. The DA converter according to claim 2, wherein the first noise reduction circuit is provided between the first wiring and the second wiring, and a reference potential, and is electrically coupled, by at least one of the plurality of first switches, to a wiring that is not selected by the conversion circuit out of the first wiring and the second wiring.

11. The DA converter according to claim 2, wherein the first noise reduction circuit is configured to discharge electric charge charged in the conversion circuit when at least one of the plurality of first switches is in an on state.

12. The DA converter according to claim 2, wherein the conversion circuit is provided with feedback paths between an output of the conversion circuit and each of the first wiring and the second wiring.

13. The DA converter according to claim 2, wherein the first noise reduction circuit is further provided with a first buffer between the plurality of first switches and a reference potential.

14. The DA converter according to claim 2, comprising:
a control unit configured to control a connection state of each of the plurality of first switches, wherein
the control unit is configured to control timings of the connection states of the plurality of first switches such that timing at which a digital value of the digital signal is switched arrives after the plurality of first switches are put into an on state.

15. The DA converter according to claim 14, wherein the control unit is configured to perform control such that when the first switch coupled to the first wiring is in an on state, the first switch coupled to the second wiring is put into an off state, and such that when the first switch coupled to the second wiring is in an on state, the first switch coupled to the first wiring is put into an off state.

16. The DA converter according to claim 2, wherein
the first wiring and the second wiring are coupled to a first input of the conversion circuit, and
the first current output circuit and the second current output circuit are respectively configured to further output a current according to the digital signal to a third wiring and a fourth wiring which are coupled to a second input of the conversion circuit.

17. The DA converter according to claim 16, comprising:
a second noise reduction circuit provided with a plurality of second switches respectively configured to switch whether to electrically connect to the third wiring and the fourth wiring, and provided with a second buffer between the plurality of second switches and a reference potential.

18. The DA converter according to claim 17, wherein the conversion circuit is configured to output, as a first analog signal, a voltage signal based on a current flowing the first wiring and the second wiring, and output, as a second analog signal, a voltage signal based on a current flowing in the third wiring and the fourth wiring.

19. The DA converter according to claim 2, wherein the plurality of current output circuits further include a third current output circuit and a fourth current output circuit respectively configured to output the current according to the digital signal to a plurality of wirings.

20. The DA converter according to claim 1, wherein the plurality of current output circuits further include a third current output circuit and a fourth current output circuit respectively configured to output the current according to the digital signal to a plurality of wirings.

* * * * *